United States Patent [19]

Ogawa et al.

[11] Patent Number: 5,235,527
[45] Date of Patent: Aug. 10, 1993

[54] METHOD FOR DIAGNOSING ABNORMALITY OF SENSOR

[75] Inventors: Masaki Ogawa; Yoshiaki Kato, both of Aichi, Japan

[73] Assignee: Toyota Jidosha Kabushiki Kaisha, Aichi, Japan

[21] Appl. No.: 974,310

[22] Filed: Nov. 10, 1992

Related U.S. Application Data

[63] Continuation of Ser. No. 648,868, Jan. 31, 1991, abandoned.

[30] Foreign Application Priority Data

Feb. 9, 1990 [JP] Japan .................................. 2-30120

[51] Int. Cl.$^5$ .................................................. G06F 15/20
[52] U.S. Cl. ................................. 364/571.05; 340/653; 364/431.11; 364/551.01
[58] Field of Search ...................... 364/571.01, 571.02, 364/571.04, 571.05, 571.07, 571.08, 550, 551.01, 556, 431.11, 424.03; 324/500, 537; 371/14; 340/635, 653

[56] References Cited

U.S. PATENT DOCUMENTS

| | | | |
|---|---|---|---|
| 4,660,386 | 4/1987 | Hansen et al. | 364/185 X |
| 4,764,884 | 8/1988 | Noyori | 364/431.11 X |
| 4,780,826 | 10/1988 | Nakano et al. | 364/431.11 X |
| 4,788,956 | 12/1988 | Suzuki et al. | 364/431.11 X |
| 4,922,425 | 5/1990 | Mack et al. | 364/431.11 X |
| 4,928,242 | 5/1990 | Suzuki | 364/424.1 X |
| 4,979,117 | 12/1990 | Hattori et al. | 364/431.11 X |
| 5,003,954 | 4/1991 | Yakuwa et al. | 364/431.11 X |
| 5,005,142 | 4/1991 | Lipchak et al. | 364/550 |
| 5,056,022 | 10/1991 | Witkowski et al. | 364/431.11 X |

FOREIGN PATENT DOCUMENTS

62-47528 3/1987 Japan .
63-70019 5/1988 Japan .

Primary Examiner—Kevin J. Teska
Attorney, Agent, or Firm—Oliff & Berridge

[57] ABSTRACT

There is provided a method for diagnosing an abnormal state of a sensor having a nonlinear output characteristic in which an output signal of a sensor changes nonlinearly. The method includes the steps of determining a first detection value which is indicated by the output signal of the sensor at a predetermined time, and determining a second detection value which is indicated by the output signal of the sensor obtained when a detection value indicated by the output signal has changed by a predetermined variation from the first detection value. The method also includes judging whether or not a deviation between the first detection value and the second detection value is out of a predetermined range, and determining that the sensor has an abnormal state when it is determined that the deviation is out of the predetermined range.

40 Claims, 7 Drawing Sheets

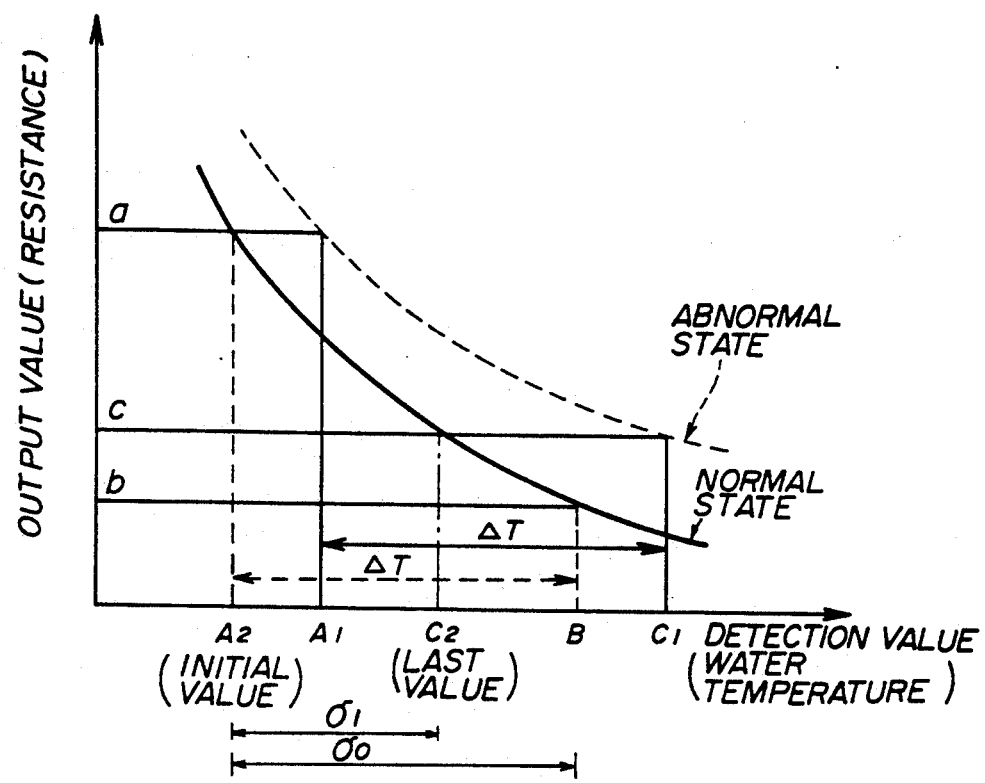
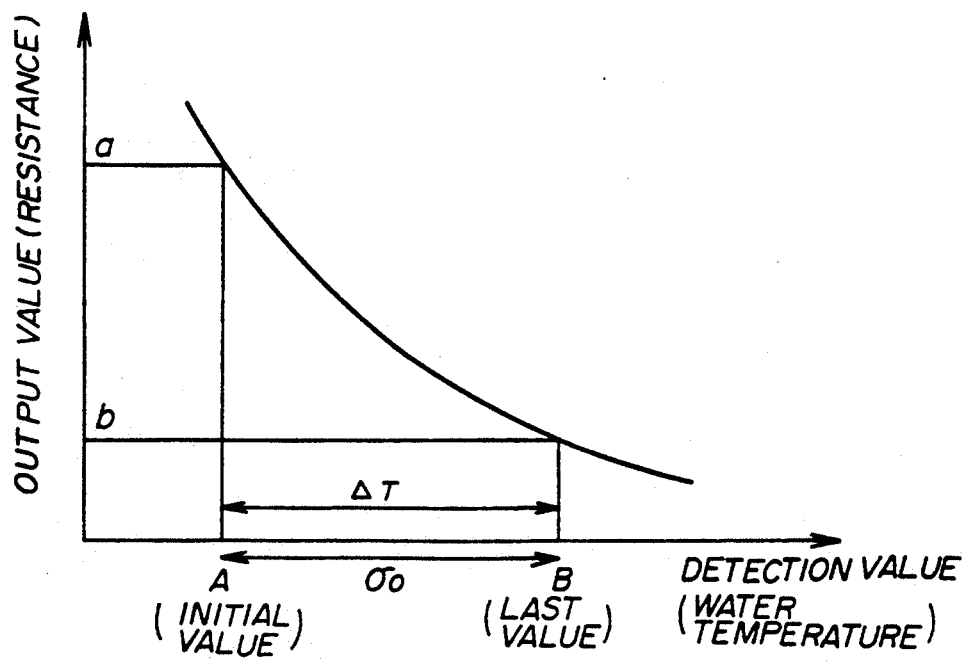

METHOD FOR DIAGNOSING ABNORMALITY OF SENSOR

This is a continuation of U.S. application Ser. No. 07/648,868 filed Jan. 31, 1991, now abandoned.

BACKGROUND OF THE INVENTION

1. Field of the Invention

The present invention generally relates to a method for diagnosing an abnormality of a sensor, and more particularly to an abnormality diagnosis method suitable for various sensors provided for an electronic control type engine.

2) Description of Related Arts

Generally, various sensors, such as a water temperature sensor and an air flow meter, are provided for an internal combustion engine equipped with a fuel injection control system. The fuel injection control system receives output signals generated and output by the sensors, and controls fuel injection on the basis of the received output signals. Such a fuel injection control can provide an amount of fuel injected suitable for the current condition of the engine, so that improved engine characteristics can be obtained.

When the sensors are normally working, the fuel injection control can be carried out accurately. On the other hand, if a failure (abnormal state) occurs in any one of the sensors, the fuel injection control will provide an incorrect fuel amount. For this reason, it is necessary to definitely detect an abnormality of each sensor in its early stage. For this purpose, the engine is equipped with a diagnostic system.

Japanese Laid-Open Patent Application No. 62-47528 discloses a method for diagnosing an abnormality of temperature sensors. The proposed method uses a temperature switch which carries out a switching operation at a predetermined temperature. A correction value is calculated on the basis of a numerical relationship between the output value of the temperature sensor obtained when the temperature switch operates and a predetermined design value. The output value of the temperature sensor is corrected in accordance with the calculated correction value.

Japanese Laid-Open Utility Model Application No. 63-70019 discloses a method for detecting an abnormality of a connector part of a sensor, such as a defect in connection, by determining whether or not a variation in the output value of the sensor exceeds a predetermined value.

However, the above-mentioned proposed methods have the following disadvantages. The method disclosed in Japanese Laid-Open Patent Application No. 62-47528 needs the temperature switch specifically used for abnormality diagnosis. This increases the production cost. The method disclosed in Japanese Laid-Open Utility Model Application No. 63-70019 can detect only a failure which results from an instant change in the output signal of the sensor, which will be caused by the occurrence of a serious defect in connection. If an oxide film is formed on a connecting portion of the connector part of the sensor, the sensor characteristic will gradually deteriorate. In this case, the proposed method cannot detect such a deterioration with age.

SUMMARY OF THE INVENTION

It is a general object of the present invention to provide an improved sensor abnormality diagnosing method in which the above-mentioned disadvantages are eliminated.

A more specific object of the present invention is to provide a sensor abnormality diagnosing method capable of diagnosing not only an abnormality which occurs instantaneously but also an abnormality which appears gradually.

The above-mentioned objects of the present invention are achieved by a method for diagnosing a sensor of which analog output changes nonlinearly with respect to a parameter sensed by the sensor, the output of the sensor being converted to a digital signal by an analog-to-digital converter, the digital signal is forwarded to an electronic unit which recognizes the digital signal as a value relating to a physical parameter by using data stored beforehand in the unit and defining a relationship between the digital signal and the value relating to a physical parameter based on a characteristic of the normal sensor, the method comprising the steps of:

a) converting an analog output of the sensor to a first digital number;

b) forwarding the first digital number to the electronic unit;

c) recognizing the first digital signal as a first value relating to a physical parameter by using the data;

d) storing the value relating to the physical parameter by using the data as an initial value;

e) determining whether or not the parameter has changed by a predetermined value from the value at the time of the storing initial value;

f) converting an analog output of the sensor to a second digital number when determined that the parameter has changed by a predetermined value from the value at the time of the storing initial value;

g) forwarding the second digital number to the electronic unit;

h) recognizing the digital signal as a second value relating to a physical parameter by using the data;

i) storing the second value relating to the physical parameter by using the data as a last value;

j) calculating a difference between the last value and the initial value; and k) judging the sensor is abnormal when the calculated difference is substantially not equal to the predetermined value.

The above-mentioned objects of the present invention are also achieved by a method for diagnosing an abnormal state of a sensor having a nonlinear output characteristic in which an output signal of a sensor changes nonlinearly, the method comprising the steps of:

a) determining a first detection value which is indicated by the output signal of the sensor at a predetermined time;

b) determining a second detection value which is indicated by the output signal of the sensor obtained when a detection value indicated by the output signal has changed by a predetermined variation from the first detection value;

c) judging whether or not a deviation between the first detection value and the second detection value is out of a predetermined range; and d) determining that the sensor has an abnormal state when it is determined that the deviation is out of the predetermined range.

BRIEF DESCRIPTION OF THE DRAWINGS

Other objects, features and advantages of the present invention will become apparent from the following detailed description when read in conjunction with the accompanying drawings, in which:

FIG. 1 is a graph illustrating the principle of the method for diagnosing abnormality of a sensor according to the present invention;

FIG. 2 is a graph illustrating a case where a diagnostic procedure is carried out for a sensor which does not have a characteristic deviation from a predetermined characteristic;

DESCRIPTION OF THE PREFERRED EMBODIMENTS

Figure 3:
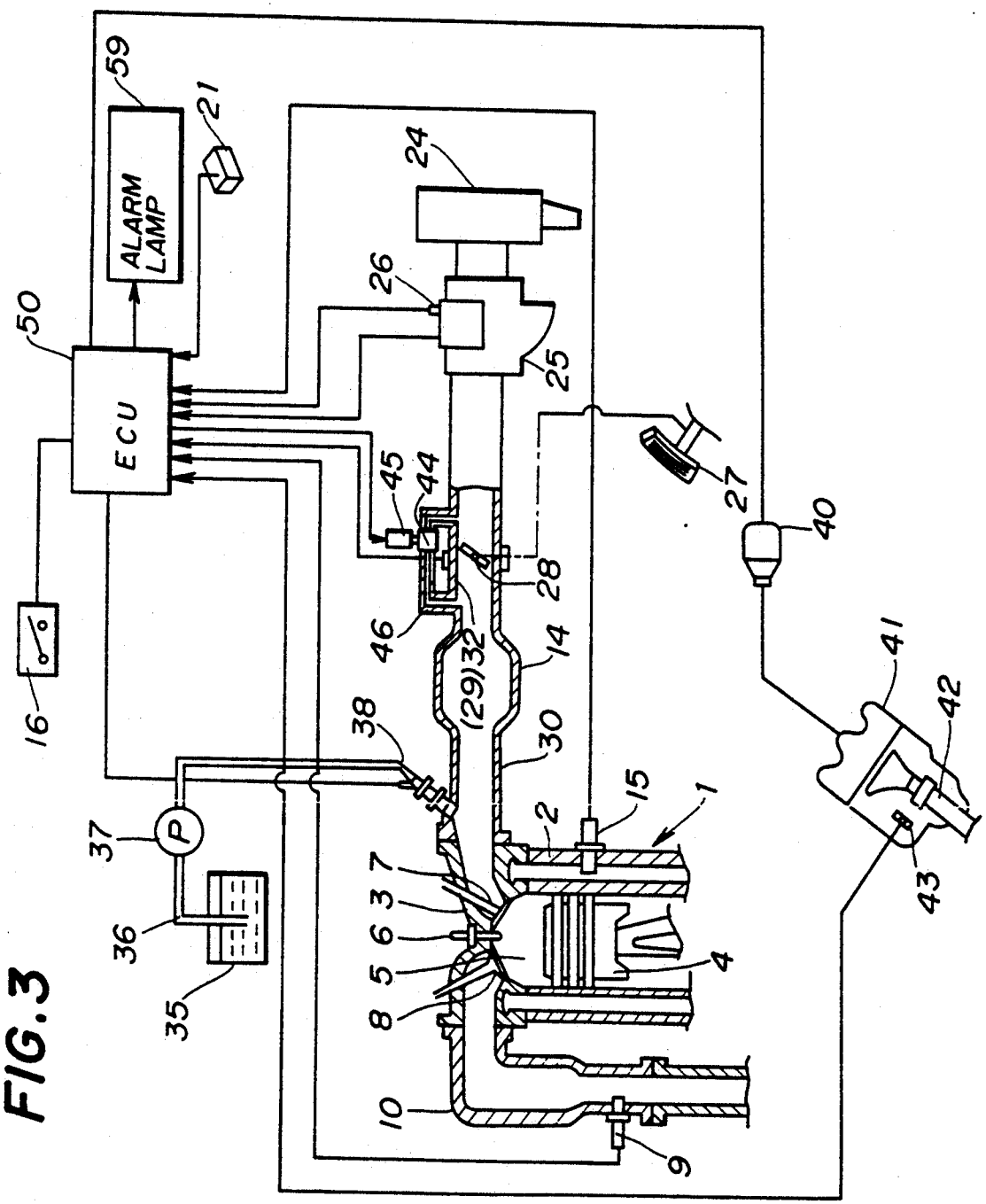
FIG. 3 is a diagram illustrating the entire structure of an engine to which a method for diagnosing abnormality of a sensor according to a preferred embodiment of the present invention is applied.

A description will now be given of the principle of the diagnostic method according to the present invention with reference to FIGS. 1 and 2. A broken line in FIG. 1 shows an output characteristic of a sensor which has a characteristic deviation (i.e. abnormal), and FIG. 2 shows an output characteristic of a sensor which has no characteristic deviation (i.e. abnormal). Each of the graphs of FIGS. 1 and 2 has a vertical axis which represents the output value of the sensor, and a horizontal axis which represents a detected value corresponding to the sensor output value. It is noted that the detected value can be called "a recognized value", which is a value that an engine control unit comprising a read only memory recognizes as a value of a real physical parameter. In a water temperature sensor, for example, the vertical axis represents its resistance value or voltage value, and the horizontal axis represents the temperature of water. In an air flow meter, the vertical axis represents the voltage value generated by the air flow meter, and the horizontal axis represents an intake air amount.

It should be noted that the present invention can diagnose abnormal states of sensors having nonlinear output characteristics. In other words, the present invention cannot diagnose abnormal states of sensors having linear output characteristics. For the sake of convenience, the diagnostic procedure for a water temperature sensor according to the first embodiment of the present invention will be described below. Of course, the present invention is not limited to the water temperature sensor, and can be applied to other nonlinear output sensors.

Referring FIG. 2, assuming that the water temperature sensor has a resistance value "a", a temperature A corresponding to the resistance value "a" is obtained or recognized. This means that the temperature of the engine is equal to A (° C.). Now, the temperature A is determined to be an initial value. The output characteristic shown in FIG. 2 is stored beforehand in the form of a map in a read only memory (ROM) of an engine control unit (ECU). The output value (resistance value) of the water temperature sensor is supplied to the ROM, which outputs the corresponding detection value (temperature of water).

When the temperature goes up to the temperature B in FIG. 2, the ECU inputs a resistance value from the sensor, which is, in this case, "b". At this point, the temperature corresponding to the resistance value "b" is B. This detected or recognized temperature B is defined as a last value. The temperature corresponding to the resistance value "b" is B. The temperature B is defined as a last value. The initial value A and the last value B related to FIG. 2 reflect the water temperatures correctly because the water temperature sensor does not have any output characteristic deviation.

A deviation $\sigma_0$ of the last value B from the initial value A is calculated by subtracting the last value B from the initial value A. That is, $\sigma_0 = B\text{-}A$. It becomes possible to determine whether or not an abnormality has occurred in the output characteristic of the water temperature sensor by comparing the deviation $\sigma_0$ with the above-mentioned temperature variation $\Delta T$. When the temperature does not have any characteristic deviation, the deviation $\sigma_0$ should be equal to the temperature variation $\Delta T$. As a result, it is determined that the water temperature sensor does not have any abnormality when $\sigma_0 = \Delta T$.

On the other hand, FIG. 1 shows an abnormal output characteristic shown by a curve of the broken line. It is noted that a solid line in FIG. 1 is the same as the solid line in FIG. 2 and stored as a map in the ROM. For example, an output deviation between the normal output characteristic and the abnormal output characteristic is caused by the formation of an oxide film on a connecting part of a connector of the water temperature sensor. Such an oxide film is gradually formed and increases the contact resistance of the connector. Therefore, the temperature, recognized or detected by the ECU or output by the ROM in the ECU, is incorrect and different from the real water temperature, since the ROM stores the conversion map based on the characteristic of the normal sensor in FIG. 2, as mentioned, and the ECU recognizes the temperature by using the map and the sensor output. The use of such an incorrect water temperature does not control the engine correctly. Such a sensor output characteristic deviation can be detected by the diagnostic procedure according to the present invention.

In FIG. 1, assuming that the water temperature sensor outputs the resistance value "a", the real water temperature is A1, nevertheless the ROM in the ECU outputs a temperature A2 because the ROM stores the normal sensor output characteristic shown by the solid line in FIG. 1. The water temperature A2 is set to be the initial value. After that, the sensor output (resistance value) is detected when the temperature detected by the water temperature sensor deviates from the initial value A2 by a predetermined variation (which is now set equal to ΔT). In other words, the ECU inputs the sensor output, that is, the ECU detects the sensor output, when the real temperature has changed by a predetermined variation ΔT so that the real temperature has reached a temperature C1. Since the real initial value is equal to A1, the sensor output obtained when the temperature deviates from the real initial value A1 by ΔT is equal to C1. At this time, the resistance value output by the water temperature sensor is equal to "c". Thus, a temperature C2 is obtained by referring to the map which shows the normal sensor output characteristic. The temperature C2 is set to be the last value.

A deviation $\sigma$ between the initial value A2 and the last value C2 is equal to C2−A2. It is noted that this deviation is described as $\sigma_1$ in FIG. 1. The deviation $\sigma_1$ is smaller than the temperature variation ΔT. As has been described previously, the deviation should be equal to the temperature variation ΔT when the water temperature sensor does not have any characteristic deviation. On the other hand, if the water temperature sensor has a characteristic deviation, the deviation $\sigma_1$ is not equal to the temperature variation ΔT. Thus, it becomes possible to diagnose such an abnormality of the water temperature sensor by comparing the deviation $\sigma$ with the temperature deviation ΔT. It will be noted the deviation $\sigma$ obtained when the sensor having a linear output characteristic does not have any characteristic deviation will be equal to that obtained when it has a characteristic deviation.

Referring to FIG. 3, there is illustrated the entire structure of an internal combustion engine to which the diagnostic procedure according to the present invention is applied. The structure shown in FIG. 3 has an engine main body 1, a cylinder block 2, a cylinder head 3, a piston 4, a combustion room 5, an ignition plug 6, an inlet air valve 7, an exhaust valve 8, an exhaust manifold 10, an oxygen sensor 9 which measures the concentration of, oxygen in an exhaust gas in the exhaust manifold 10, a water temperature sensor 15 which measures the temperature of a coolant, an ignition switch 16 and a battery source 21.

In an air intake system of the engine, an air flow meter 25 measures the amount of intake air introduced in an air cleaner 24, and an inlet air temperature sensor 26 measures the temperature of the intake air. A throttle valve 28, which is controlled by the position of an accelerator pedal, supplies an appropriate amount of intake air to an intake manifold 30. A throttle body of the throttle value 28 is equipped with an idle switch 29, which detects the open angle of the throttle valve 28 provided in the throttle body as well as the closed state thereof. An inlet air manifold 14 is equipped with a bypass 46 which bypasses the throttle valve 28. The bypass 46 is provided with an idle speed control valve (ISCV) 44 which opens or closes the bypass 46, and a stepping motor 45 which drives the idle speed control valve 44. A fuel injection valve 38 is provided in the vicinity of the inlet air valve 7 of the inlet manifold 30. The fuel injection valve 38 supplies the inlet air manifold 30 with a predetermined amount of fuel which is supplied from a fuel tank 35 via a passage 36 in a compressed state made by a fuel pump 37.

In an ignition system of the engine shown in FIG. 3, a high voltage generated by an ignition coil 40 is applied to a distributor 41, which carries out a predetermined injection timing control and distributes the high voltage to the injection plug 6 of each cylinder at a predetermined timing. A revolution sensor 43 provided for the distributor 41 detects rotating angles and revolutions from rotating positions of a distributor shaft 42, which rotates in synchronism with a crankshaft (not shown for the sake of simplicity). More specifically, the revolution sensor 43 generates a pulse at an interval corresponding to a crank shaft angle of 30°, and generates a pulse at a predetermined angle for each one revolution of the crank shaft. An alarm lamp 59 is turned ON when an abnormality has occurred in any of the sensors, as will be described later.

Figure 4:
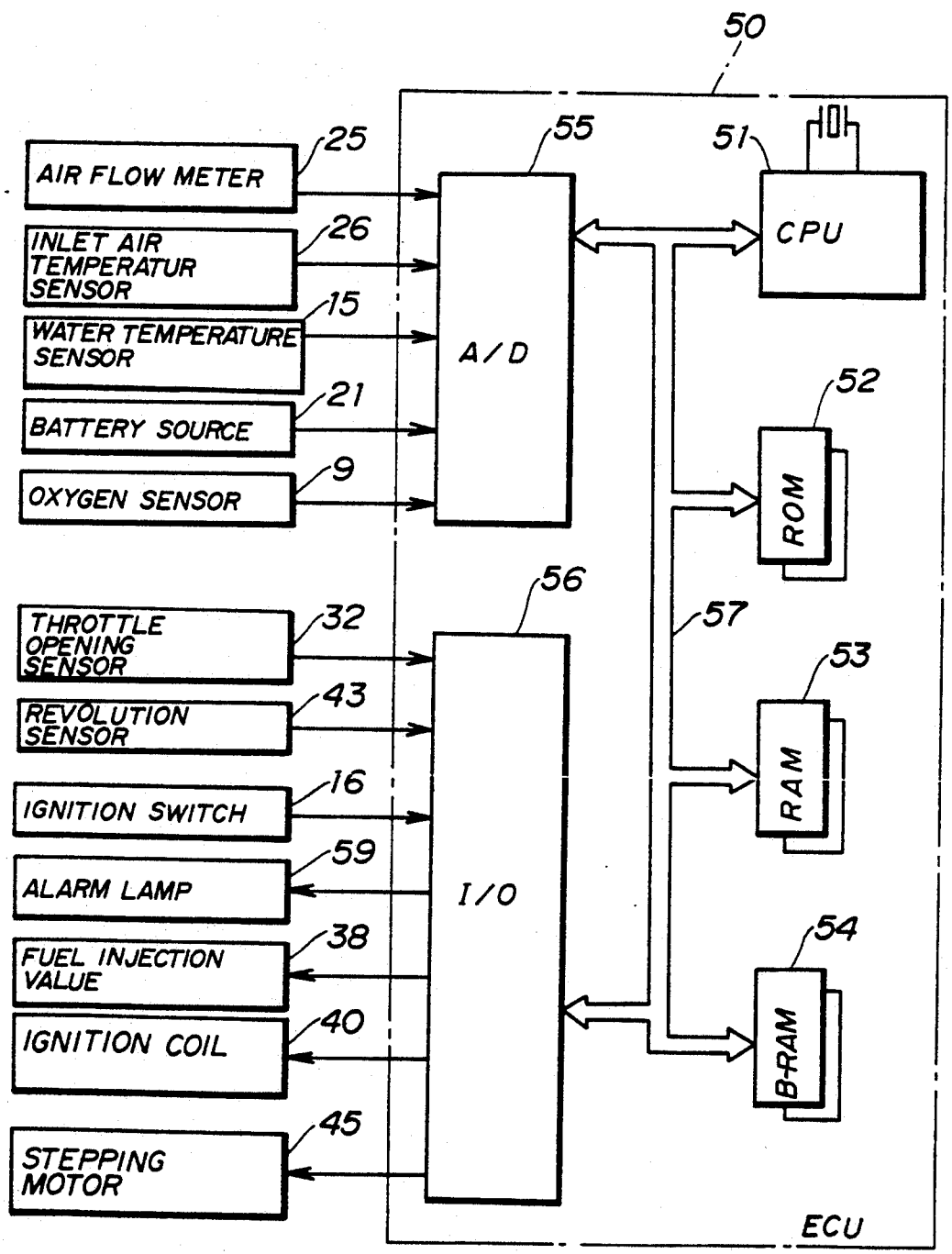
FIG. 4 is a block diagram of a hardware structure of an electronic control unit (ECU) shown in FIG. 3.

An electronic control unit (hereafter simply referred to as an ECU) 50 is a microcomputer driven by the battery source 21, and has a structure shown in FIG. 4. The ECU 50 includes a central processing unit (CPU) 51, a read only memory (ROM) 52, a random access memory (RAM) 53, and a backup random access memory (B-RAM) 54 which stores information even if the power supply is turned OFF. The ROM 52 stores programs related to a main routine, a fuel injection amount control routine, an injection period control routine, and a diagnostic routine according to the present invention, data and constants necessary for the above-mentioned routines, which includes the map showing the output characteristic shown in FIG. 2. Further, the ECU 50 has an analog-to-digital (A/D) converter 55 having a multiplexer, and an input/output (I/0) interface circuit 56. A c bus 57 mutually connects the CPU 51, the ROM 52, the RAM 53, the B-RAM 54, the A/D converter 55 and the I/O interface circuit 56.

The output signals of the sensors, such as the air flow meter 25, the inlet air temperature sensor 26 and the water temperature sensor 15, are input to the multiplexer in the A/D converter 55, which outputs the output signals to the CPU 51 and the RAM 53 or the B-RAM 54 at predetermined periods defined by the CPU 51. The RAM 53 or the B-RAM 54 is supplied with the latest detection data related to the inlet air amount, inlet air temperature and water temperature, and stores the data in predetermined storage areas. The I/O interface circuit 56 is supplied with the output signals of the sensors, such as the throttle opening sensor 32 and the revolution sensor 43, and sends these output signals to the CPU 51 and the RAM 53 or the B-RAM 54 at predetermined periods defined by the CPU 51. The CPU 51 calculates an air injection amount on the basis of the data detected from the sensors in accordance with the corresponding program stored in the ROM 52, and carries out the diagnostic procedure, as will be described below.

Figure 5:
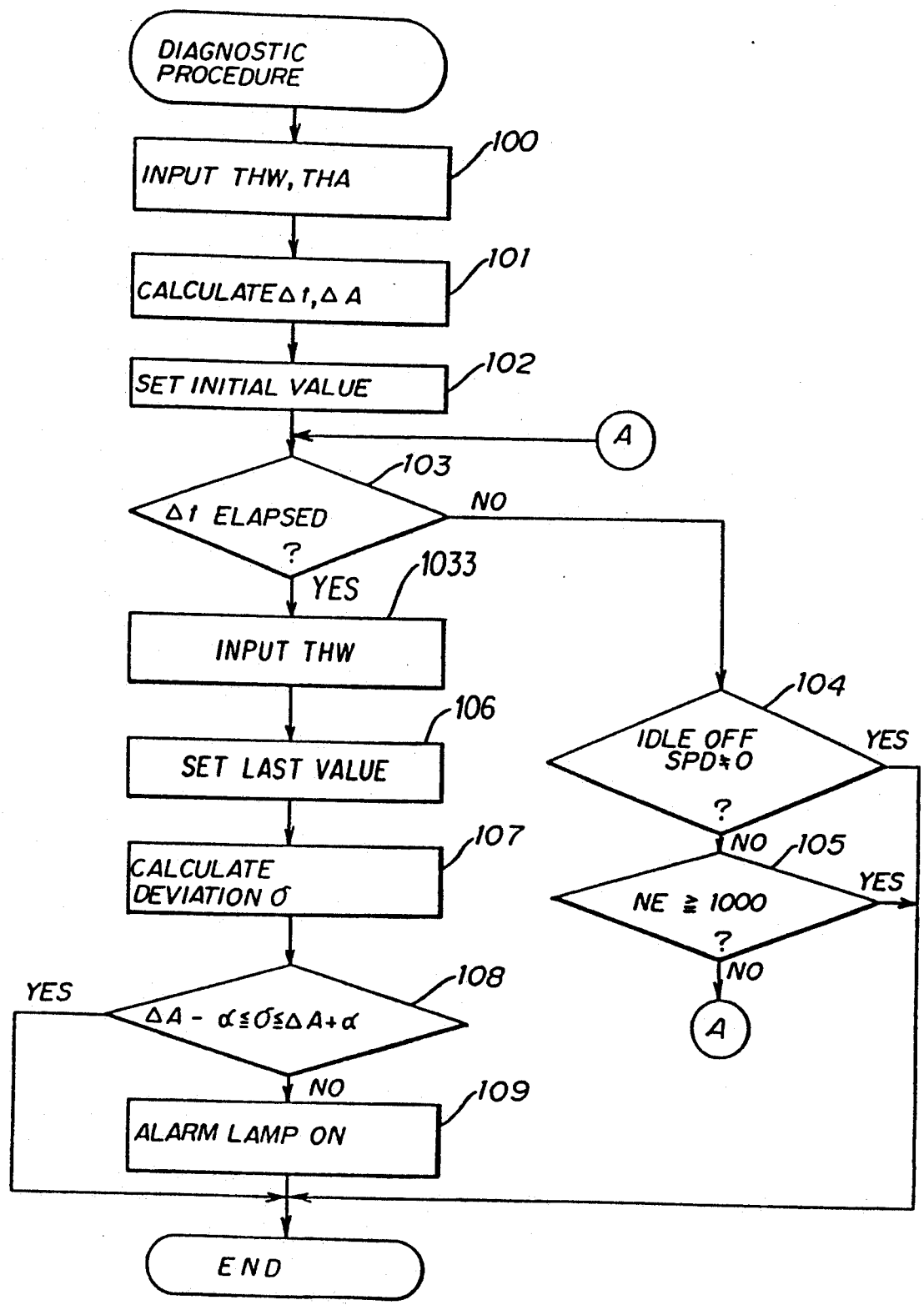
FIG. 5 is a flowchart illustrating a diagnostic procedure according to a first preferred embodiment of the present invention.
Figure 6:
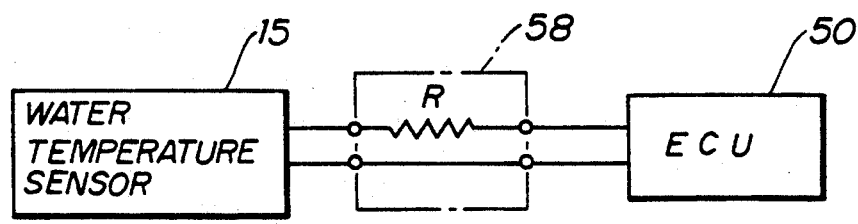
FIG. 6 is a block diagram showing that a contact resistance occurs in a connection portion of a connector.

Referring to FIG. 5, there is illustrated a diagnostic procedure according to the first preferred embodiment of the present invention. The diagnostic procedure shown in FIG. 5 detects an abnormal state of the water temperature sensor 15, and is carried out on the dealer side. A maintenance operator inputs a check signal to the ECU 50 to start the diagnostic procedure.

Figure 7:
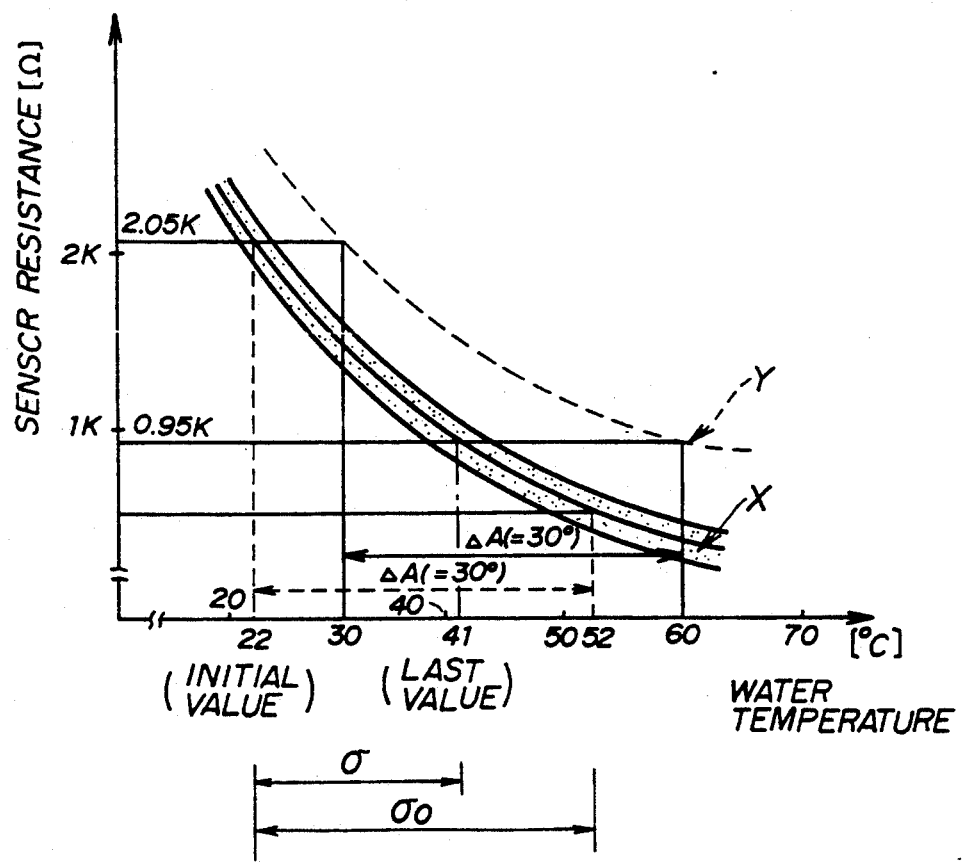
FIG. 7 is a graph illustrating an output characteristic of a water temperature sensor which has a characteristic deviation and an output characteristic of a water temperature sensor which has no characteristic deviation.

The following description relates to a case where an oxide film is formed on a connector 58 which connects the water temperature sensor 15 and the ECU 50 to each other and thus a contact resistance R ($\approx$ 400 ohms, for example) appears. It is now assumed that the water temperature sensor 15 has an output characteristic shown in FIG. 7, in which a capital letter "X" indicates an original (normal) output characteristic of the water temperature sensor 15 (shown by the solid line), and a capital letter "Y" indicates an output characteristic thereof (shown by the broken line) which has a characteristic deviation from the above original output characteristic. It will be noted that the output characteristics shown in FIG. 7 are nonlinear. The ROM 52 of the ECU 50 stores a map showing the original output characteristic indicated by "X", so that the current water temperature can be obtained from the sensor resistance.

After the diagnostic procedure shown in FIG. 5 is activated by the maintenance operator, at step 100, the CPU 51 inputs a water temperature output signal THW from the water temperature sensor 15, in other words, the CPU 51 inputs a resistance value of the water temperature sensor 15 through the A/D converter 55 and obtains the value of the THW by the map stored in the ROM 52 with using the resistance value, and an inlet air temperature output signal THA from the inlet air temperature sensor 26. At step 101, the CPU 51 calculates a variation $\Delta A$ from the above THW and THA, and calculates the time $\Delta t$ necessary to change the water temperature by $\Delta A$. In this calculation, the variation $\Delta A$ is selected so that it is most suitable for the abnormality diagnostic procedure. If the variation $\Delta A$ is large, it will taken a long time to need the execution of the diagnostic procedure, and a large amount of external distribution may be input. On the other hand, if the variation $\Delta A$ is small, the accuracy of the diagnosis will deteriorate. For example, the variation $\Delta A$ is set to be 30° C.

At step 102, the initial value is set. That is, the THW obtained at step 100 is memorized as the initial value. It is now assumed that the real water temperature is 30° C. As has been described previously, the output characteristic deviation has occurred in the water temperature sensor 15 due to the occurrence of the contact resistance. Thus, as shown in FIG. 7, the water temperature sensor 15 has the output characteristic Y which deviates from the original output characteristic X. As a result, when the real water temperature is equal to 30° C., the sensor resistance value is equal to 2.05 k. Since the ROM 52 stores only the output characteristic X, the CPU 51 recognizes the water temperature to be equal to 22° C. This temperature, 22° C., is set to be the initial value.

At step 103, the CPU 51 determines whether or not the time $\Delta t$ has elapsed from the time when the initial value (equal to 22° C.) is set. The time $\Delta t$ is the time it takes for the water temperature to increase from the initial value ($=22°$ C.) by the predetermined variation $\Delta A$ ($=30°$ C.). In other words, the time $\Delta t$ is the time period in which the water temperature rises from the first real water temperature when the initial value is set, to the second real water temperature which is larger than the first real water temperature by the temperature $\Delta T$. Thus, step 103 defines a procedure for waiting for an increase in the water temperature by $\Delta A$.

If the engine condition changes greatly, and thus the water temperature also greatly changes during the time when the water temperature is increasing by the predetermined variation $\Delta A$, it becomes impossible to correctly carry out the diagnostic procedure. With the above in mind, if the accelerator pedal is stepped on, and thereby the idle switch 29 is opened, if a vehicle speed signal SPD output by the speed sensor 9 indicates a value other than zero, or if a revolution signal NE output by the revolution sensor 43 indicates 1000 rpm (revolutions per minute), the diagnostic procedure is stopped at steps 104 and 105. When the result obtained at step 105 is NO, the procedure returns to step 103.

When the time $\Delta t$ has elapsed, in other words, when the water temperature has changed by $\Delta A$, the CPU 51 inputs a water temperature obtained at this time, just like the step 100, at step 1033.

As has been described previously, the real water temperature obtained before the elapse of the time $\Delta T$ is 30° C. Thus, when the water temperature has changed by the variation $\Delta A$ ($=30°$ C.), the real water temperature is equal to 60° C. The resistance value of the water temperature sensor 15 dependent on the output characteristic Y shown in FIG. 7 is equal to 0.95 k$\Omega$. Since the ROM 52 in the ECU 50 stores only the output characteristic X shown in FIG. 7, the CPU 51 recognizes the water temperature obtained after the elapse of time $\Delta t$ to be 41° C. This temperature, 41° C., is set to be the last value at step 107.

At step 107, the CPU 51 calculates a deviation $\sigma$ between the initial value and the last value. As has been described above, the initial value is equal to 22° C., and the last value is equal to 41° C. Thus, the deviation is equal to 19° C. At step 108, the CPU 51 determines whether or not the deviation $\sigma$ obtained at step 107 falls in a predetermined tolerance range slightly wider than the predetermined variation $\Delta A$ ($\Delta A - \alpha \leq \sigma \leq \Delta A + \alpha$, where $\alpha$ is a constant). If the water temperature sensor 15 does not have any characteristic deviation, the last value will become equal to 52° C. obtained when the water temperature has increased by the predetermined variation $\Delta A$ ($=30°$ C.). Thus, the deviation $\sigma_0$ is equal to the predetermined variation $\Delta A$. On the other hand, if the water temperature sensor 15 has a characteristic deviation, the initial value is 30° C. and the deviation $\sigma$ is not equal to the predetermined variation. In this case, the CPU 51 can recognize the water temperature sensor 15 to have an abnormal state, such as a characteristic deviation. It will be noted that the constant $\alpha$ is a permissible error of the predetermined variation $\Delta A$.

When it is determined, at step 108, that the deviation $\sigma$ falls in the range of $\Delta A \pm \alpha$, the CPU 51 concludes that the water temperature sensor 51 is not in any abnormal state. On the other hand, when it is determined, at step 108, that the deviation $\sigma$ is out of the predetermined range $\Delta A \pm \alpha$, the CPU 51 concludes that the water temperature sensor 51 is in an abnormal state. At step 109, the CPU 51 has the alarm lamp 59 turn ON.

According to the first embodiment of the present invention, it is possible to determine, by means of software (without using hardware), whether or not the water temperature sensor 15 is in an abnormal state. As a result, the low-cost abnormality diagnosis can be realized. As shown in FIG. 7, the water temperature sensor 15 is recognized to be defective without exception when the output characteristic thereof deviates from the normal output characteristic. As a result, it is also possible to diagnose an abnormal state which is gradually caused due to, for example, an increase in the contact resistance.

A description will now be given of a second preferred embodiment of the present invention with reference to FIG. 8. The second embodiment of the present invention carries out a procedure for diagnosing abnormal states of the air flow meter 25 provided on the engine main body 1 which has the idle speed control valve 44. In the following explanation, it is assumed that the air flow meter 25 has an output deviation equal to 0.5V, and has output characteristics shown in FIG. 9. More specifically, a curve indicated by a capital letter "X" in FIG. 9 shows an original (normal) output characteristic of the air flow meter 25 having no characteristic deviation, and a curve indicated by a capital letter "Y" shows an output characteristic of the air flow meter having an output characteristic deviation. It will be noted that the original output characteristic of the air flow meter 25 is a nonlinear characteristic. The ROM 52 of the ECU 50 stores the output characteristic indicated by "X" in FIG. 9, so that the ECU 50 can calculate an intake air amount corresponding to the output voltage of the air flow meter 25.

Figure 8:
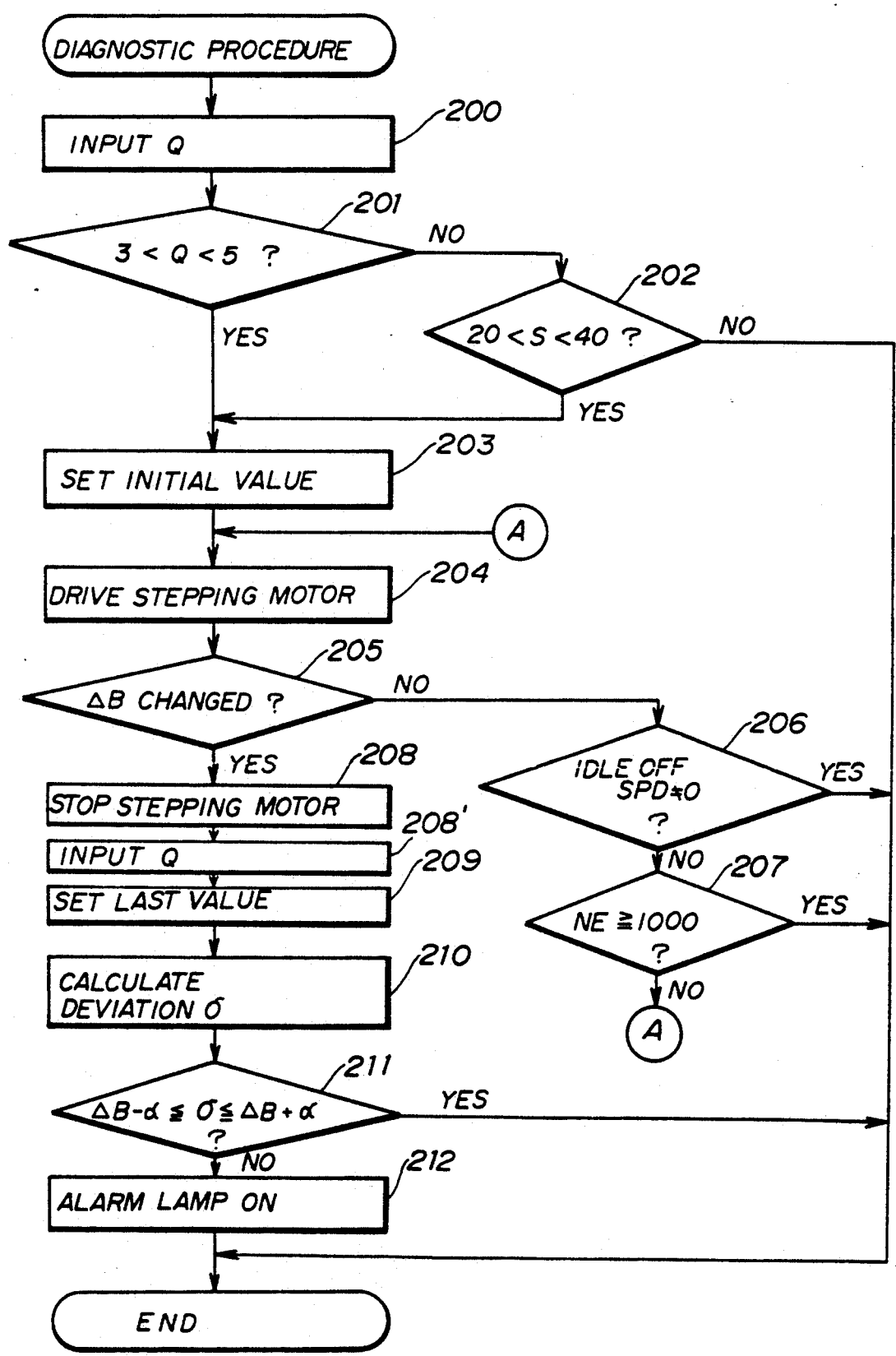
FIG. 8 is a flowchart of a diagnostic procedure according to a second preferred embodiment of the present invention.
Figure 9:
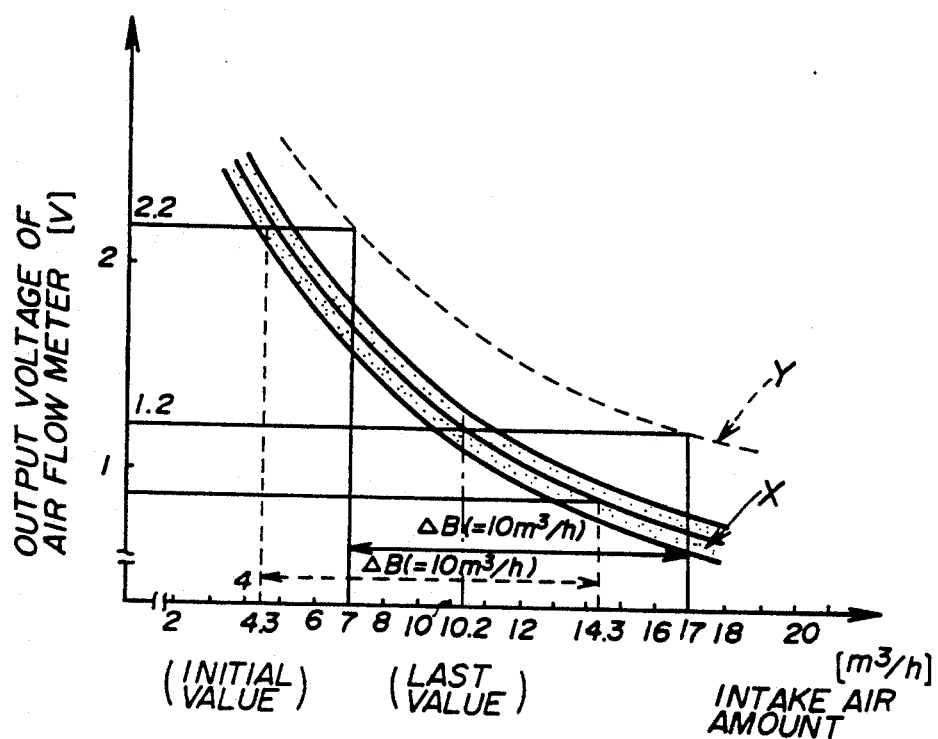
FIG. 9 is a graph illustrating an output characteristic of an air flow meter having a characteristic deviation and an output characteristic of an air flow meter having no characteristic deviation.

After the diagnostic procedure shown in FIG. 8 is started, at step 201, the CPU 51 determines whether an intake air amount Q falls within a range between $3m^3/h$ and $5m^3/h$. When the result at step 201 is NO, the CPU 51 determines, at step 202, whether or not the number of steps, S, supplied to the stepping motor 45 for driving the idle speed control valve 44 falls within a range between 20 and 40. Steps 201 and 202 are carried out for the following reason. As is well known, in an idle condition where the throttle valve 28 is maintained in the completely closed state, the opening angle of the idle speed control valve 44 determines the amount of intake air. That is, the idle control is carried out by means of the idle speed control valve 44. The idle speed control valve 44 is controlled in such a way that the CPU 51 carries out a duty ratio control which controls the number of steps supplied to the stepping motor 45.

Figure 10:
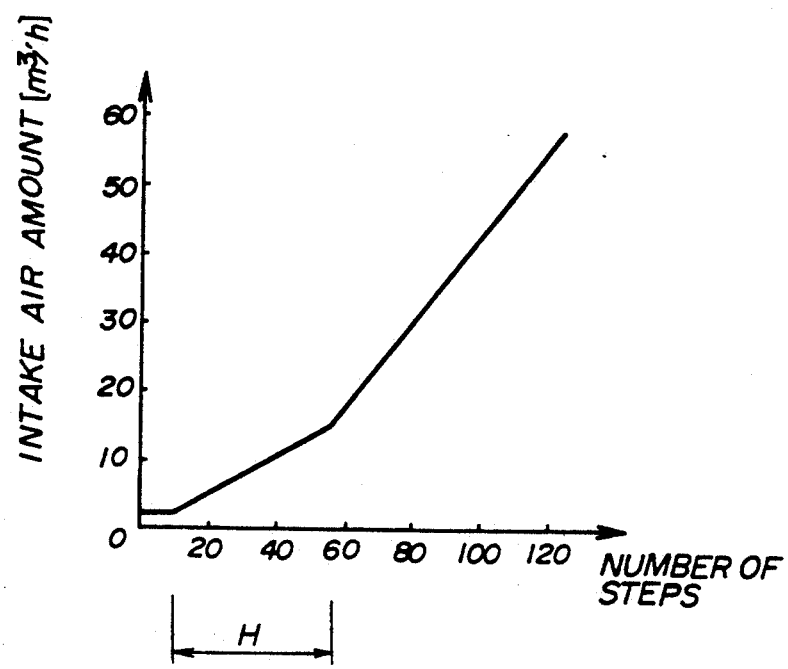
FIG. 10 is a graph illustrating a relationship between the number of steps applied to a stepping motor and an intake air amount.

FIG. 10 shows the relationship between the number of steps S and the intake air amount ($m^3/h$). It will be seen from the graph of FIG. 10 that the relationship is not linear in the entire range, but is partially linear. The second embodiment of the present invention carries out the diagnostic procedure within the range between about 10 steps and about 55 steps indicated by a capital letter "H" in FIG. 10. Steps 201 and 202 judge whether or not the stepping motor 45 is being controlled outside of the above-mentioned range H, and if the judgment result is affirmative, the CPU 51 concludes the current condition is not suitable for the diagnostic procedure and ends the diagnostic procedure.

On the other hand, when the judgment result at step 201 or step 202 is YES, the CPU 51 sets the initial value. Assuming that the current amount of intake air is equal to $7m^3/h$, the air flow meter 25 having a characteristic deviation has the output characteristic illustrated by the broken line in FIG. 9. Thus, the real output voltage of the air flow meter 25 is equal to 2.2V. However, the ROM 52 of the ECU 50 stores only the output characteristic indicated by "X", the CPU 51 determines the current amount of intake air to be 4.3 $m^3/h$. This intake air amount is input at step 200. At step 203, the CPU 51 sets the initial value to be 4.3 $m^3/h$.

At step 204, the CPU 51 drives the stepping motor 45 so that the idle speed control valve 44 is opened and the intake air amount increases by $\Delta B$, which is determined beforehand as a value optimum to the diagnostic procedure. In the second embodiment of the present invention, the variation $\Delta B$ is set equal to 10 $m^3/h$.

According to the aforementioned first embodiment of the present invention, the diagnostic procedure is not carried out until the engine is sufficiently warmed up and so that the water temperature increases by $\Delta A$ from the initial water temperature. On the other hand, according to the second embodiment of the present invention, it is possible to rapidly and easily change the intake air amount by $\Delta B$ since the intake air amount is controlled by controlling the idle speed control valve 44 by the stepping motor 45 under the control of the CPU 51, and the number of steps and the intake air amount has the correlation shown in FIG. 9. For the above-mentioned reasons, the second embodiment of the present invention is capable of carrying out the diagnostic procedure more accurately than the first embodiment of the present invention. When the result at step 205 is NO, steps 206 and 207 are carried out in the same way as steps 104 and 105 shown in FIG. 5.

When the result at step 205 is YES, the CPU 51 stops the operation of the stepping motor 45 at step 208, an determines the last value. At step 208, the CPU 51 inputs an intake air amount obtained at this time. Since the real amount of intake air obtained before the variation $\Delta B$ changes is 7 $m^3/h$, when the amount of intake air changes by the predetermined variation $\Delta B$ (=10 $m^3/h$), the real amount of intake air is equal to 17 $m^3/h$. That is, the air flow meter 25 has a characteristic deviation. At this time, the output voltage of the air flow meter 25 is 1.2V. Since the ROM 52 has only the output characteristic indicated by "X", the CPU 51 determines the amount of intake air obtained when it has changed by $\Delta B$ to be 10.2 $m^3/h$. In this way, the last value (=10.2 $m^3/h$ in this case) is determined at step 209 after the intake air amount Q is input at step 208'.

At step 210, the CPU 51 calculates the deviation $\sigma$ between the initial value and the last value. In the case being considered, the deviation $\sigma$ is equal to 5.9 $m^3/h$ since the initial value is equal to 4.3 $m^3/h$ and the last value is equal to 10.2 $m^3/h$. At step 211, the CPU 51 determines whether or not the deviation $\sigma$ falls within a predetermined range related to the predetermined variation $\Delta B$, that is $\Delta B - \alpha \leq \sigma \leq \Delta B + \alpha$. If the air flow meter 25 does not have any output characteristic deviation, when the intake air amount is changed by $\Delta B (=10 m^3/h)$ from the initial value equal to 4.3 $m^3/h$, the intake air amount will be 14.3 $m^3/h$. Thus, the deviation of the last value from the initial value is equal to the predetermined variation $\Delta B$. On the other hand, if the air flow meter 25 has an output characteristic deviation, the deviation $\sigma$ is different from the predetermined variation $\Delta B$. Thus, when the result at step 211 is NO, the CPU 51 concludes that the air flow meter 25 has an output characteristic deviation, and turns the alarm lamp 59 ON. It will be noted that "$\alpha$" is a permissible error of the predetermined variation $\Delta B$.

It can be seen from the above description that according to the second embodiment of the present invention, it is possible to determine, by means of software (without using hardware), whether or not the air flow meter 25 is in an abnormal state. As a result, the low-cost abnormality diagnosis can be realized. As shown in FIG. 9, the air flow meter 25 is recognized to be defective without exception when the output characteristic thereof deviates from the normal output characteristic. As a result, it is also possible to diagnose an abnormal state which is gradually caused due to, for example, an increase in the contact resistance.

The present invention is not limited to the specifically disclosed embodiments of the present invention, and variations and modifications with sensors having nonlinear output characteristics may be made without departing from the scope of the present invention.

What is claimed is:

1. A method for diagnosing a machine operating condition sensor having an analog output which changes nonlinearly with respect to a physical condition of the machine sensed by the sensor, said analog output of the sensor being converted to a digital signal by an analog-to-digital converter, said digital signal being forwarded to an electronic unit which recognizes said digital signal as a value relating to said physical condition of the machine by using data stored beforehand in said unit which defines a relationship between said digital signal and said value relating to said physical condition based on a characteristic of a normal sensor, said method comprising the steps of:

a) converting an analog output of said sensor to a first digital signal;
   b) forwarding said first digital signal to said electronic unit;
   c) recognizing said first digital signal as a first value relating to said physical condition by using said data;
   d) storing said first value relating to said physical condition as an initial value;
   e) changing, by a predetermined value, said physical condition of the machine to which said sensor is attached;
   f) converting an analog output of said sensor to a second digital signal when said physical condition has been changed by said predetermined value;
   g) forwarding said second digital signal to said electronic unit;
   h) recognizing said second digital signal as a second value relating to said physical condition by using said data;
   i) storing said second value relating to said physical condition as a last value;
   j) calculating a difference between said last value and said initial value; and
   k) judging said sensor is abnormal when said calculated difference is substantially not equal to said predetermined value.

2. A method as claimed in claim 1, wherein said step e) further comprises the steps of:
   setting a time which it takes for said condition to change by said predetermined value from the value at the time of storing said initial value; and
   determining whether or not said time has elapsed since the time of storing said initial value.

3. A method as claimed in claim 1, wherein said step e) further comprises the steps of:
   setting a time which it takes for said condition to change by said predetermined value from the value at the time of storing said initial value;
   measuring a time period since the time of storing said initial value;
   terminating said measuring when another condition of the machine changes; and
   determining whether or not said time has elapsed since the time of storing said initial value.

4. A method as claimed in claim 3, wherein said condition of said machine in said terminating step is an idling state of said machine.

5. A method as claimed in claim 1, wherein said judging step k) further comprises the steps of:
   judging whether or not said calculated difference is within a range defined with respect to said predetermined value; and
   determining said sensor is abnormal when said calculated difference is out of said defined range.

6. A method as claimed in claim 5, wherein said step e) further comprises the steps of:
   setting a time which it takes for said condition to change by said predetermined value from said value at the time of storing said initial value; and
   determining whether or not said time has elapsed since the time of storing said initial value.

7. A method as claimed in claim 5, wherein said step e) further comprises the steps of:
   setting a time which it takes for said condition to change by said predetermined value from the value at the time of storing said initial value;
   measuring a time period since the time of storing said initial value;
   terminating said measuring when another condition of the machine changes; and
   determining whether or not said time has elapsed since the time of storing said initial value.

8. A method as claimed in claim 7, wherein said condition of said machine in said terminating step is an idling state of said machine.

9. An apparatus for diagnosing an abnormal state of a machine operating condition sensor having a nonlinear output characteristic in which an output signal of a sensor changes nonlinearly in response to a physical condition of the machine to be detected by said sensor, said apparatus comprising:

a) means for determining a first detection value which is indicated by the output signal of said sensor at a predetermined time;
   b) means for changing, by a predetermined value, said physical condition of the machine to which said sensor is attached;
   c) means for determining a second detection value which is indicated by the output signal of said sensor obtained when said physical condition has been changed by said predetermined value;
   d) means for judging whether or not a deviation between said first detection value and said second detection value is substantially equal to said predetermined value; and
   e) means for determining that said sensor is abnormal when judged that said deviation is substantially not equal to said predetermined value.

10. An apparatus as claimed in claim 9, wherein:
    said means for determining a second detection value comprises means for judging whether or not a predetermined time has elapsed; and
    said change in said physical condition has occurred when said predetermined time has elapsed.

11. An apparatus as claimed in claim 9, wherein said means for determining a second detection value comprises means for changing said predetermined value in response to said first detection value.

12. An apparatus as claimed in claim 9, wherein said means for determining a second detection value comprises:
    means for accessing a table which defines a relationship between the output signal of said sensor and detection values indicated by said output signal; and
    means for obtaining a corresponding one of said detection values defined by said table in response to the output signal of said sensor obtained when said physical condition has been changed by said predetermined value, said corresponding one of said detection values corresponding to said second detection value.

13. An apparatus as claimed in claim 9, wherein said means for determining a first detection value comprises:
   means for accessing a table which defines a relationship between the output signal of said sensor and detection values indicated by said output signal; and
   means for obtaining a corresponding one of said detection values defined by said table in response to the output signal of said sensor obtained at said predetermined time, said corresponding one of said detection values corresponding to said first detection value.

14. An apparatus as claimed in claim 13, wherein said means for determining a second detection value comprises:
   means for accessing a table which defines a relationship between the output signal of said sensor and detection values indicated by said output signal; and
   means for obtaining a second corresponding one of said detection values defined by said table in response to the output signal of said sensor obtained when said physical condition has been changed by said predetermined value, said second corresponding one of said detection values corresponding to said second detection value.

15. An apparatus as claimed in claim 9, wherein:
   said machine is an engine, and said sensor is a water temperature sensor which detects coolant temperature of the engine; and
   said means for determining a second detection value includes means for calculating said predetermined value of said change by utilizing an output signal of said water temperature sensor.

16. An apparatus as claimed in claim 15, wherein:
   said means for determining a second detection value comprises means for judging whether or not a predetermined time has elapsed; and
   said change in said physical condition has occurred when said predetermined time has elapsed.

17. An apparatus as claimed in claim 16, further comprising:
   means for judging whether or not said engine is operating in a predetermined way; and
   means for terminating said diagnosing when it is determined that said engine is not operating in said predetermined way.

18. An apparatus as claimed in claim 9, wherein:
   said machine is an engine, and said sensor is a water temperature sensor which detects coolant temperature of the engine, said engine also having an inlet air temperature sensor; and
   said means for detecting a second detection value includes means for calculating said predetermined value of said change by utilizing both an output signal of said water temperature sensor and an output signal of said inlet air temperature sensor.

19. An apparatus as claimed in claim 18, wherein:
   said means for determining a second detection value comprises means for judging whether or not a predetermined time has elapsed; and
   said change in said physical condition has occurred when said predetermined time has elapsed.

20. An apparatus as claimed in claim 19, further comprising:
   means for judging whether or not said engine is operating in a predetermined way; and
   means for terminating said diagnosing when it is determined that said engine is not operating in said predetermined way.

21. An apparatus as claimed in claim 9, wherein said machine is an engine, and said sensor is a sensor which detects an intake air amount of the engine.

22. An apparatus as claimed in claim 21, further comprising:
   means for determining whether or not a detection value indicated by the output signal of said sensor falls within a predetermined intake air amount range; and
   means for terminating said diagnosing when it is determined that the detection value indicated by the output signal of said sensor is out of said predetermined intake air amount range.

23. An apparatus as claimed in claim 21, wherein:
   said apparatus further comprises an idle speed control valve for controlling speed of said engine by changing an amount of intake air to said engine; and
   said changing means comprises means for opening said idle speed control valve by a predetermined opening value to change said physical condition of the engine.

24. An apparatus as claimed in claim 21, further comprising:
   an idle speed control valve for controlling speed of said engine by changing an amount of intake air to said engine; and
   a stepping motor driving the idle speed control valve,
   wherein said changing means comprises control means for changing a number of steps applied to said stepping motor to change said physical condition of the engine.

25. An apparatus as claimed in claim 24, further comprising:
   means for determining whether or not the number of steps applied to said stepping motor falls within a predetermined step number range; and
   means for terminating said diagnosing when it is determined that the number of steps is out of said predetermined step number range.

26. A method for diagnosing a sensor having an analog output which changes nonlinearly in response to a physical condition of a machine to which said sensor is attached, said analog output being converted to a digital signal by an analog-to-digital converter, said digital signal being processed by an electronic unit having data stored in said unit which defines a relationship between said digital signal and a value relating to said physical condition, said method comprising the steps of:
   a) converting an analog output of said sensor to a first digital signal;
   b) forwarding said first digital signal to said electronic unit;
   c) recognizing said first digital signal as a first value relating to said physical condition by using said data in said electronic unit;
   d) storing said first value as an initial value;
   e) changing, by a predetermined value, said physical condition of the machine to which said sensor is attached;
   f) converting an analog output of said sensor to a second digital signal when said physical condition has been changed by said predetermined value;
   g) forwarding said second digital signal to said electronic unit;

h) recognizing said second digital signal as a second value relating to said physical condition by using said data in said electronic unit;
i) storing said second value as a last value;
j) calculating a difference between said last value and said initial value; and
k) judging said sensor is abnormal when said difference is substantially not equal to said predetermined value.

27. A method for diagnosing a machine operating condition sensor having an analog output which changes nonlinearly with respect to a physical condition of the machine sensed by the sensor, said analog output of the sensor being converted to a digital signal by an analog-to-digital converter, said digital signal being forwarded to an electronic unit which recognizes said digital signal as a value relating to said physical condition of the machine by using data stored beforehand in said unit which defines a relationship between said digital signal and said value relating to said physical condition based on a characteristic of a normal sensor, said method comprising the steps of:
a) converting an analog output of said sensor to a first digital signal using an A/D converter;
b) forwarding said first digital signal to said electronic unit, said electronic unit comprising a central processing unit, a read only memory and at least one random access memory for storing said data;
c) recognizing, with said electronic unit, said first digital signal as a first value relating to said physical condition by using said data stored in said read only memory;
d) storing said first value relating to said physical condition as an initial value in said at least one random access memory;
e) changing, by a predetermined value, said physical condition of the machine to which said sensor is attached in accordance with information stored in said read only memory;
f) converting, with said A/D converter, an analog output of said sensor to a second digital signal when said physical condition has been changed by said predetermined value;
g) forwarding said second digital signal to said electronic unit;
h) recognizing, with said electronic unit, said second digital signal as a second value relating to said physical condition by using said data stored in said read only memory;
i) storing said second value relating to said physical condition as a last value in said at least one random access memory;
j) calculating a difference between said last value and said initial value using said central processing unit; and
k) judging, with said electronic unit, said sensor is abnormal when said calculated difference is substantially not equal to said predetermined value.

28. A method for diagnosing a machine operating condition sensor having an analog output which changes nonlinearly with respect to a physical condition of the machine sensed by the sensor, said analog output of the sensor being converted to a digital signal by an analog-to-digital converter, said digital signal being forwarded to an electronic unit which recognizes said digital signal as a value relating to said physical condition of the machine by using data stored beforehand in said unit which defines a relationship between said digital signal and said value relating to said physical condition based on a characteristic of a normal sensor, said method comprising the steps of:
a) converting an analog output of said sensor to a first digital signal;
b) forwarding said first digital signal to said electronic unit;
c) recognizing said first digital signal as a first value relating to said physical condition by using said data;
d) storing said first value relating to said physical condition as an initial value;
e) changing, by a predetermined value, said physical condition of the machine to which said sensor is attached;
f) converting an analog output of said sensor to a second digital signal when said physical condition has been changed by said predetermined value;
g) forwarding said second digital signal to said electronic unit;
h) recognizing said second digital signal as a second value relating to said physical condition by using data;
i) storing said second value relating to said physical condition as a last value;
j) calculating a difference between said last value and said initial value;
k) judging said sensor is abnormal when said calculated difference is substantially not equal to said predetermined value;
l) signalling that said sensor is abnormal by activating an alarm; and
m) replacing said sensor with another sensor.

29. A method for diagnosing an engine water temperature sensor having an analog output which changes nonlinearly with respect to water temperature of the engine sensed by the sensor, said analog output of the sensor being converted to a digital signal by an analog-to-digital converter, said digital signal being forwarded to an electronic unit which recognizes said digital signal as a value relating to said engine water temperature by using data stored beforehand in said unit which defines a relationship between said digital signal and said value relating to said engine water temperature based on a characteristic of a normal sensor, said method comprising the steps of:
a) converting an analog output of said sensor to a first digital signal;
b) forwarding said first digital signal to said electronic unit;
c) recognizing said first digital signal as a first value relating to said engine water temperature by using said data;
d) storing said first value relating to said engine water temperature as an initial value;
e) changing said engine water temperature by a predetermined value;
f) converting an analog output of said sensor to a second digital signal when said engine water temperature has been changed by said predetermined value;
g) forwarding said second digital signal to said electronic unit;
h) recognizing said second digital signal to a second value relating to said engine water temperature by using said data;

i) storing said second value relating to said engine water temperature as a last value;

j) calculating a difference between said last value and said initial value; and k) judging said sensor is abnormal when said calculated difference is substantially not equal to said predetermined value.

30. A method as claimed in claim 29, wherein said changing step comprises running said engine for a predetermined period of time to thereby change said engine water temperature by said predetermined value.

31. A method for diagnosing an engine intake air amount sensor having an analog output which changes nonlinearly with respect to intake air amount of the engine sensed by the sensor, said analog output of the sensor being converted to a digital signal by an analog-to-digital converter, said digital signal being forwarded by an electronic unit which recognizes said digital signal as a value relating to said engine intake air amount by using data stored beforehand in said unit which defines a relationship between said digital signal and said value relating to said engine intake air amount based on a characteristic of a normal sensor, said method comprising the steps of:

a) converting an analog output of said sensor to a first digital signal;

b) forwarding said first digital signal to said electronic unit;

c) recognizing said first digital signal as a first value relating to said engine intake air amount by using said data;

d) storing said first value relating to said engine intake air amount as an initial value;

e) changing said engine intake air amount by a predetermined value;

f) converting an analog output of said sensor to a second digital signal when said engine intake air amount has been changed by said predetermined value;

g) forwarding said second digital signal to said electronic unit;

h) recognizing said second digital signal as a second value relating to said engine intake air amount by using said data;

i) storing said second value relating to said engine intake air amount as a last value;

j) calculating a difference between said last value and said initial value; and k) judging said sensor is abnormal when said calculated difference is substantially not equal to said predetermined value.

32. A method as claimed in claim 31, wherein said changing step comprises opening an idle speed control valve by a predetermined amount to thereby change said engine intake air amount by said predetermined value.

33. A method as claimed in claim 32, wherein said opening step includes the steps of controlling said idle speed control valve when a stepping motor, and controlling said stepping motor with said electronic unit.

34. An apparatus for diagnosing a machine operating condition sensor having an analog output which changes nonlinearly with respect to a physical condition of the machine sensed by the sensor, said apparatus comprising:

a) an analog-to-digital converter for converting an analog output of said sensor to a first digital signal;

b) an electronic unit comprising a central processing unit, a read only memory and at least one random access memory;

c) means for forwarding said first digital signal to said electronic unit;

d) means for recognizing, with said electronic unit, said first digital signal as a first value relating to said physical condition by using data, stored beforehand in said read only memory, which defines a relationship between said digital signal and said value relating to said physical condition based on a characteristic of a normal sensor;

e) means for storing said first value relating to said physical condition as an initial value in said at least one random access memory;

f) means for changing, by a predetermined value, said physical condition of the machine to which said sensor is attached in accordance with information stored in said at least one random access memory;

g) means for converting, with said analog-to-digital converter, an analog output of said sensor to a second digital signal when said physical condition has been changed by said predetermined value;

h) means for forwarding said second digital signal to said electronic unit;

i) means for recognizing, with said electronic unit, said second digital signal as a second value relating to said physical condtion by using said data stored in said read only memory;

j) means for storing said secnd value relating to said physical condition as a last value in said at least one random access memory;

k) means for calculating, with said central processing unit, a difference between said last value and said initial value; and l) means for judging, with said electronic unit, that said sensor is abnormal when said calculated difference is substantially not equal to said predetermined value.

35. An apparatus for diagnosing a machine operating condition sensor having an analog output which changes nonlinearly with respect to a physical condition of the machine sensed by the sensor, said apparatus comprising:

a) an analog-to-digital converter for converting an analog output of said sensor to a first digital signal;

b) an electronic unit;

c) means for forwarding said first digital signal to said electronic unit;

d) means for recognizing, with said electronic unit, said first digital signal as a first value relating to said physical condition by using data, stored beforehand in said electronic unit, which defines a relationship between said digital signal and said value relating to said physical condition based on a characteristic of a normal sensor;

e) means for storing said first value relating to said physical condition as an initial value;

f) means for changing, by a predetermined value, said physical condition of the machine to which said sensor is attached;

g) means for converting, with said analog-to-digital converter, an analog output of said sensor to a second digital signal when said physical condition has been changed by said predetermined value;

h) means for forwarding said second digital signal to said electronic unit;

i) means for recognizing, with said electronic unit, said second digital signal as a second value relating to said physical condition by using said data;

j) means for storing said second value relating to said physical condition as a last value;

k) means for calculating a difference between said last value and said initial value;

l) means for judging, with said electronic unit, that said sensor is abnormal when said calculated difference is substantially not equal to said predetermined value;

m) means for actuating an alarm to signal that said sensor is abnormal; and n) means for replacing said sensor with another sensor.

36. An apparatus for diagnosing an engine water temperature sensor having an analog output which changes nonlinearly with respect to water temperature of the engine sensed by the sensor, said apparatus comprising:

a) an analog-to-digital converter for converting an analog output of said sensor to a first digital signal;

b) an electronic unit;

c) means for forwarding said first digital signal to said electronic unit;

d) means for recognizing, with said electronic unit, said first digital signal as a first value relating to said engine water temperature by using data, stored beforehand in said electronic unit, which defines a relationship between said digital signal and said value relating to said engine water temperature based on a characteristic of a normal sensor;

e) means for storing said first value relating to said engine water temperature as an initial value;

f) means for changing said water temperature by a predetermined value;

g) means for converting, with said analog-to-digital converter, an analog output of said sensor to a second digital signal when said engine water temperature has been changed by said predetermined value;

h) means for forwarding said second digital signal to said electronic unit;

i) means for recognizing, with said electronic unit, said second digital signal as a second value relating to said engine water temperature by using said data;

j) means for storing said second value relating to said engine water temperature as a last value;

k) means for calculating a difference between said last value and said initial value; and l) means for judging, with said electronic unit, that said sensor is abnormal when said calculated difference is substantially not equal to said predetermined value.

37. An apparatus as claimed in claim 36, wherein said means for changing said water temperature comprises means for running said engine for a predetermined period of time.

38. An apparatus for diagnosing an engine intake air amount sensor having an analog output which changes nonlinearly with respect to intake air amount of the engine sensed by the sensor, said apparatus comprising:

a) an analog-to-digital converter for converting an analog output of said sensor to a first digital signal;

b) an electronic unit;

c) means for forwarding said first digital signal to said electronic unit;

d) means for recognizing, with said electronic unit, said first digital signal as a first value relating to said engine intake air amount by using data, stored beforehand in said electronic unit, which defines a relationship between said digital signal and said value relating to said engine intake air amount based on a characteristic of a normal sensor;

e) means for storing said first value relating to said engine intake air amount as an initial value;

f) means for changing said engine intake air amount by a predetermined value;

g) means for converting, with said analog-to-digital converter, an analog output of said sensor to a second digital signal when said engine intake air amount has been changed by said predetermined value;

h) means for forwarding said second digital signal to said electronic unit;

i) means for recognizing, with said electronic unit, said second digital signal as a second value relating to said engine intake air amount by using said data;

j) means for storing said second value relating to said engine intake air amount as a last value;

k) means for calculating a difference between said last value and said initial value; and l) means for judging, with said electronic unit, that said sensor is abnormal when said calculated difference is substantially not equal to said predetermined value.

39. An apparatus as claimed in claim 38, wherein said means for changing said engine intake air amount comprises means for opening an idle speed control valve by a predetermined amount.

40. An apparatus as claimed in claim 39, wherein said means for opening comprises a stepping motor for controlling said idle speed control valve, and wherein said stepping motor is controlled by said electronic unit.

* * * * *